United States Patent [19]

Armiento

[11] Patent Number: 4,729,967
[45] Date of Patent: Mar. 8, 1988

[54] METHOD OF FABRICATING A JUNCTION FIELD EFFECT TRANSISTOR

[75] Inventor: Craig A. Armiento, Acton, Mass.

[73] Assignee: GTE Laboratories Incorporated, Waltham, Mass.

[21] Appl. No.: 36,411

[22] Filed: Apr. 9, 1987

[51] Int. Cl.$^4$ .......................................... H01L 21/265
[52] U.S. Cl. ...................... 437/40; 357/22; 156/656; 156/653; 148/DIG. 88; 437/184; 437/944; 437/911
[58] Field of Search ............. 357/22; 156/659.1, 653, 156/657, 652, 656, 643; 29/571, 576 B, 578, 579; 148/DIG. 88; 437/40, 184, 911, 944

[56] References Cited

U.S. PATENT DOCUMENTS

| | | | |
|---|---|---|---|
| 4,351,099 | 9/1982 | Takagi et al. | 29/578 |
| 4,406,052 | 9/1983 | Cogan | 29/576 B |
| 4,468,682 | 8/1984 | Cogan | 357/22 |
| 4,477,963 | 10/1984 | Cogan | 29/571 |
| 4,532,004 | 7/1985 | Akiyama et al. | 29/571 |
| 4,551,909 | 11/1985 | Cogan et al. | 29/571 |
| 4,670,090 | 6/1987 | Sheng et al. | 29/578 |
| 4,672,406 | 6/1987 | Sawada et al. | 357/22 |

OTHER PUBLICATIONS

Cogan et al., "High Performance Microwave Static Induction Transistors", IEDM, 1983, pp. 221–224.
Bencuya et al., "Static Induction Transistors Optimized for High Voltage Operation and High Microwave Power Output", IEEE Trans. on Electron Devices, vol. ED-32, No. 7, Jul. 1985, pp. 1321–1327.

Primary Examiner—Brian E. Hearn
Assistant Examiner—Mary A. Wilczewski
Attorney, Agent, or Firm—David M. Keay

[57] ABSTRACT

Method of fabricating a junction field effect transistor, specifically a static induction transistor, which may be of GaAs. Elongated N-type source regions are formed in an N-type epitaxial layer of semiconductor material grown on a substrate. A tri-level mask is formed having elongated openings exposing portions of the epitaxial layer intermediate between the source regions. The openings are wider at the bottom than at the top. P-type gate regions are formed by ion-implanting P-type doping material through the mask openings. Silicon dioxide is deposited through the openings by angle evaporation to form generally trapezoidal-shaped temporary gate members over the gate regions. The tri-level mask is removed, a layer of silicon nitride is deposited, and a layer of masking material is deposited. Some of the masking material is removed; then the temporary gate members and silicon nitride immediately adjacent thereto are removed. Metal for making ohmic contact to the P-type gate regions is deposited through the resulting openings. The remaining masking material is removed, openings are formed in the silicon nitride over the N-type source regions, and metal for making ohmic contact to the N-type source regions is deposited in the openings.

13 Claims, 12 Drawing Figures

METHOD OF FABRICATING A JUNCTION FIELD EFFECT TRANSISTOR

This invention was made with government support under Contract No. F33615-85-C-1726 awarded by the Department of the Air Force. The government has certain rights in this invention.

BACKGROUND OF THE INVENTION

This invention relates to semiconductor devices. More particularly, it is concerned with methods of fabricating junction field effect transistors.

One type of junction field effect semiconductor device which is capable of operation at relatively high frequencies and at relatively high power is the static induction transistor. The static induction transistor is characterized by a short, high resistivity semiconductor channel region which may be controllably depleted of carriers. The current-voltage characteristics of the static induction transistor are generally similar to those of vacuum tube triodes. One form of static induction transistor is the surface-gate static induction transistor (SGSIT) which includes a set of elongated gate regions and a set of elongated source regions interdigitated with the gate regions. In the fabrication of these devices the process of localized oxidation of silicon (LOCOS) is employed to produce silicon dioxide which separates the gate regions from the source regions. Not only does the presence of the oxide provide gate-source separation, but it also has a beneficial effect on the electrical characteristics of the device. Since during the process of fabricating the device silicon oxide is produced by controlled local oxidation of exposed silicon of the body, the process is not sensitive to minor misalignment during the source and gate forming steps or in the patterning of the source and gate metallization.

For static induction transistors which are to operate at frequencies above 1 GHz, semiconductor materials other than silicon are required; for example, compound semiconductor materials such as GaAs and InP. The well-established techniques for the fabrication of silicon surface-gate static induction transistors, however, are not directly applicable to the fabrication of devices employing the other semiconductor materials, since stable native oxides cannot be formed from the compound semiconductor materials. In addition, the same metal cannot be used to make ohmic contact to both P-type regions and N-type regions in these materials as is possible with silicon. Two different types of ohmic metallizations must be separately patterned for the source and gate regions increasing the possibilities of catastrophic misalignment. Furthermore, a third metallization must be deposited and patterned to provide an interconnection of all of the gate regions and an interconnection of all of the source regions to respective bonding pads, thus presenting another possibility for misalignment.

SUMMARY OF THE INVENTION

An improved method of fabricating junction field effect transistors with reduced problems of alignment and without the use of localized oxidization techniques is provided by the method in accordance with the present invention. The method comprises providing a body of semiconductor material which includes a substrate of semiconductor material of one conductivity type of relatively low resistivity and a layer of semiconductor material of the one conductivity type of relatively high resistivity contiguous with the substrate. The layer has a surface at a surface of the body. Conductivity type imparting material of the one conductivity type is introduced into a plurality of spaced-apart source regions in the layer at the surface. A first mask is formed on the surface which has a plurality of openings. Each of the openings exposes a portion of the surface intermediate between two adjacent source regions. The first mask is undercut at each opening so that the opening is wider at the surface than at a distance from the surface. Conductivity type imparting material of the opposite conductivity type is introduced into a plurality of gate regions in the layer at the surface as defined by the plurality of openings in the first mask. A dieletric protective material is deposited onto the surface through the openings in the first mask so as to form a plurality of temporary gate members. Each temporary gate member is wider at its base which is contiguous with the surface than at its uppermost portion which is spaced from the surface. The first mask is removed to expose the surface except for the portions thereof occupied by the temporary gate members. A layer of adherent, nonconductive, protective material is deposited on the exposed surface and on the temporary gate members. Masking material is deposited on the layer of adherent, nonconductive, protective material. The masking material is removed to expose the portions of the layer of adherent, nonconductive, protective material overlying the uppermost portions of the temporary gate members. The temporary gate members and portions of the layer of adherent, nonconductive, protective material adjacent thereto are removed so that the remaining masking material forms a second mask having a plurality of openings. Each of the openings exposes a portion of the surface of one of the gate regions. The second mask is undercut at each opening so that the opening is wider at the surface than at a distance from the surface. Conductive material for making ohmic contact to semiconductor material of the opposite conductivity type is deposited onto a portion of the exposed surface of each of the gate regions defined by the openings in the second mask to form a plurality of gate contact members. The second mask is removed. A plurality of openings are formed in the layer of adherent, nonconductive, protective material to expose an area of the surface of each of the source regions. Conductive material for making ohmic contact to semiconductor material of the one conductivity type is deposited onto a portion of the exposed surface area of each of the source regions to form a plurality of source contact members. Conductive material is applied to form a source interconnection in contact with the source contact members and to form a gate interconnection in contact with the gate contact members.

In the figures the various elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following discussion and appended claims in connection with the above-described drawings.

DETAILED DESCRIPTION

In fabricating junction field effect transistors of the static induction type in accordance with the present invention as illustrated in the figures, a substrate of single crystal semiconductor material of one conductivity type is provided as a supporting structure. As is well understood the substrate is usually a slice or wafer of relatively large surface area upon which many identical devices are fabricated simultaneously. However, for purposes of illustration, the fabrication of only a portion of a single static induction transistor in a fragment of a slice will be shown and described. In the following description gallium arsenide (GaAs) is employed as the semiconductor material, and the substrate is of relatively low resistivity N-type conductivity.

Figure 1:
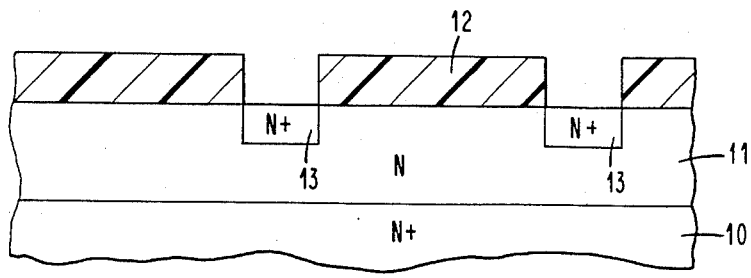
FIGS. 1–11 are a series of elevational views in cross-section of a fragment of a wafer of semiconductor material illustrating successive steps in the fabrication of a junction field effect transistor of the static induction type in accordance with the present invention.

A slice or wafer of N-type GaAs of uniform relatively low resistivity having flat, planar, parallel opposed major surfaces, a fragment 10 of which is shown in FIG. 1 is produced by any of the known techniques of crystal fabrication including appropriate slicing and cleaning operations. An epitaxial layer 11 of N-type GaAs of uniform relatively high resistivity is deposited on the surface of the substrate as by known vapor deposition techniques. A layer 11 which is precisely controlled as to thickness and as to resistivity and which is a continuation of the crystalline structure of the single crystal substrate 10 is thus deposited on the surface of the substrate. The upper surface of the epitaxial layer 11 is parallel to the interface between the substrate and the layer.

The surface of the wafer is coated with a layer of a photoresist 12. By employing conventional photolithographic techniques, openings are formed in the photoresist layer 12 to expose the surface of the body in a pattern of elongated parallel surface areas. A doping material for imparting N-type conductivity to GaAs is then introduced into the epitaxial layer 11 at the exposed surface areas by employing known ion-implantation techniques. For GaAs the doping material may be silicon, sulfur, or selenium. The photoresist mask 12 protects other portions of the body from the ion-implantation, and N-type implanted source regions 13 are formed at the exposed regions. After ion-implantation the photoresist 12 is removed and the wafer annealed in order to remove lattice damage in the region and to activate the implanted doping material.

Figure 2:
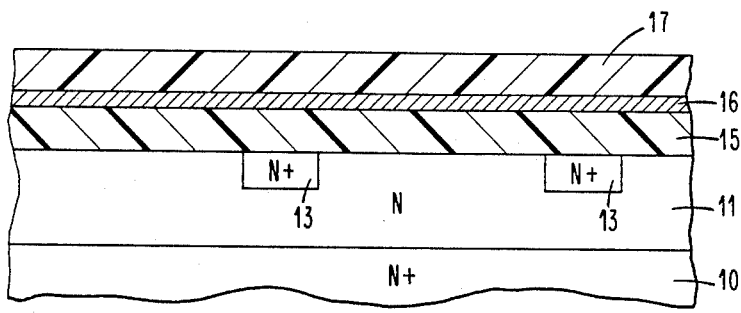
Figure 3:
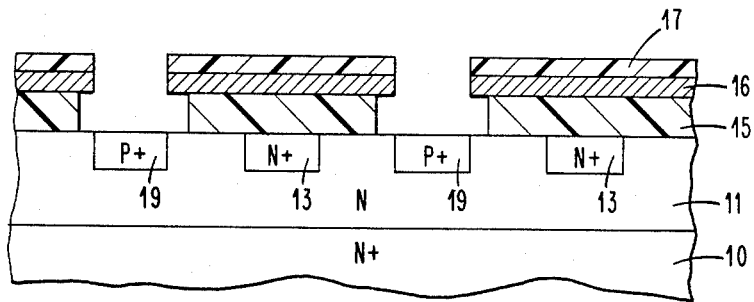

Next, a tri-level mask is formed by depositing on the surface of the epitaxial layer 11 of the wafer a first layer of a photoresist 15, a thin layer of germanium 16, and a second layer of photoresist material 17 as illustrated in FIG. 2. By an appropriate series of photolithographic and etching steps an overhanging or undercut mask as illustrated in FIG. 3 is produced from the three deposited layers 15, 16, and 17. The second or upper level of photoresist 17 is etched by employing known photolithographic masking and etching procedures to form openings in the layer 17 which overlie the regions of the surface intermediate between the existing source regions 13. The portions of the germanium layer 16 exposed at the openings in the upper photoresist layer 17 are etched by a suitable etching material which does not significantly attack the photoresist material. The wafer is then subjected to an etching material which does not significantly attack the germanium layer 16 but etches the photoresist material of the first layer 15 so as to form an undercut mask with overhanging structure as illustrated in FIG. 3. Removal of some or all of the upper photoresist layer 17 during this etching procedure is of no consequence.

P-type conductivity imparting material, specifically magnesium, beryllium, or zinc, is then ion-implanted into the exposed portions of the epitaxial layer 11 of the wafer. The overhanging mask 15, 16, 17 protects areas of the surface other than those exposed directly beneath the narrower portion of the opening at the upper portion of the mask. The P-type doping material is thus implanted into gate regions 19 as illustrated in FIG. 3.

Figure 4:
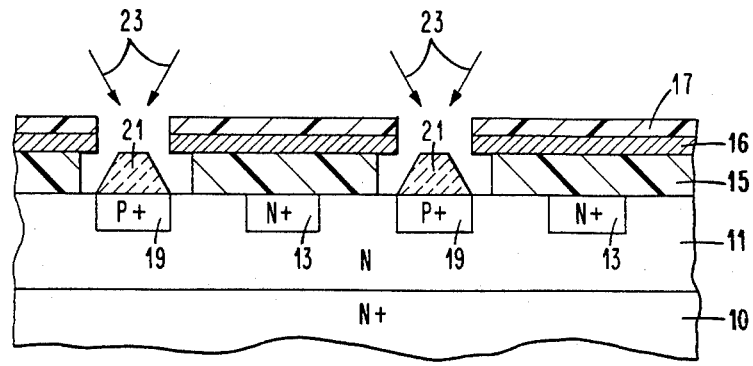

A temporary gate member 21 is then formed in the space provided by each of the openings in the undercut mask 15, 16, 17 as illustrated in FIG. 4. Dielectric material, specifically silicon dioxide, is evaporated from targets so as to impinge on the wafer assembly at angles away from normal to the surface as indicated by the arrows 23 in FIG. 4. The shadow effect of the overhanging portions of the mask 15, 16, 17 together with the directions of evaporation of the silicon dioxide (arrows 23) cause the silicon dioxide to deposit as illustrated in cross-section in FIG. 4. Each of the resulting temporary gate members 21, is generally in the shape of an isosceles trapezoid having its base contiguous with the surface of the epitaxial layer 11, its uppermost portion spaced from the surface, and its sides tapered.

Figure 5:
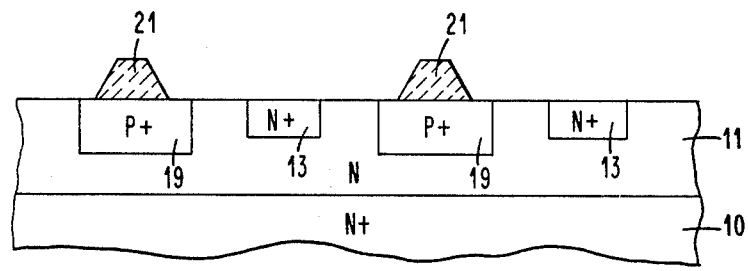

As illustrated in FIG. 5 the tri-level mask 15, 16, 17 is removed. The wafer is then treated by heating to anneal the implanted P-type ions so as to repair the lattice damage and to activate the implanted doping material. At the same time the implanted P-type doping material diffuses farther into the epitaxial layer increasing the size of the gate regions 19. The gate regions 19 expand laterally beyond the temporary gate members 21 so that the edges of the rectifying junctions between the gate regions 19 and the N-type semiconductor material of the epitaxial layer 11 are at the exposed surface of the wafer.

Figure 6:
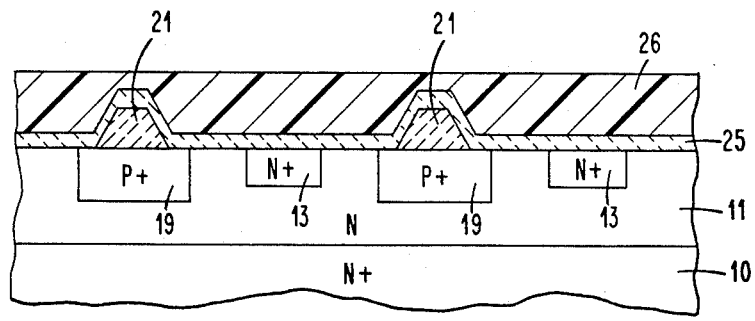

Next, as illustrated in FIG. 6, a layer 25 of a passivating dielectric material, for example silicon nitride, is deposited on the wafer. The layer 25 overlies the exposed surface of the epitaxial layer 11 including the source regions 13 and the edges of the junctions between the gate regions 19 and the contiguous N-type material. The dielectric layer 25 also overlies the temporary gate members 21. A layer 26 of a photoresist or other suitable material is then deposited on the wafer and planarized so as to provide a smooth, planar upper surface parallel to the surface of the wafer.

Figure 7:
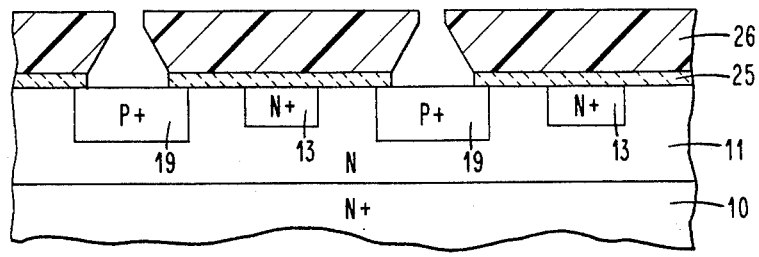

The wafer is then subjected to a reactive ion etching process to uniformly remove material of the layer 26 down to the portions of the underlying layer 25 which overlie the uppermost portions of the temporary gate members 21. After the upper surface of the silicon nitride layer 25 is exposed, the plasma chemistry of the reactive ion etching process is changed so as to selectively etch silicon nitride and silicon dioxide rather than the photoresist material 26. The process is carried to a point as illustrated in FIG. 7 so as to remove completely the temporary gate members 21 and also silicon nitride of the layer 25 immediately adjacent to the temporary gate members without exposing the junctions between the P-type gate regions 19 and the adjacent N-type material of the layer 11. As illustrated in FIG. 7 the remaining silicon nitride layer 25 and resist 26 provide a mask having openings therein exposing only portions of the gate regions 19. The mask is undercut at each opening to provide a wider opening at the surface than at a distance from the surface.

Figure 8:
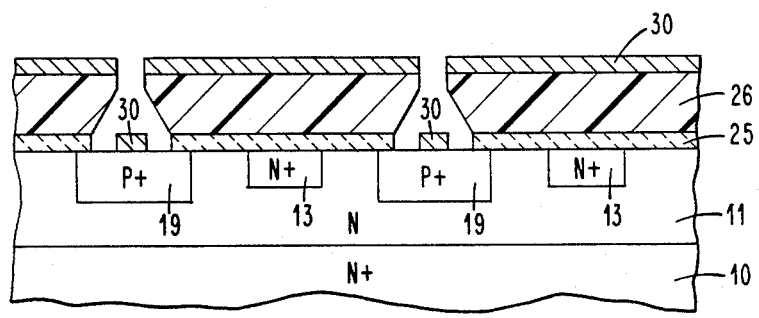

Next, as illustrated in FIG. 8, a P-type ohmic metal 30, for example, a gold zinc alloy, is deposited on the wafer. The metal 30 deposits onto the P-type gate regions 19 as determined by the narrow openings between the overhanging portions of the mask. Since the positions of the metal 30 on the surface of the gate regions 19 are determined by the location of the openings in the mask 26 which were determined by temporary gate members 21, the locations of which were determined by the same openings in the mask 15, 16, 17 which determined the position of the gate regions 19, the deposited metal 30 is precisely aligned with respect to the gate regions 19.

Figure 9:
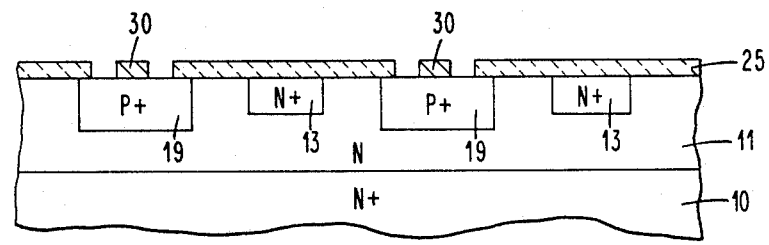

As illustrated in FIG. 9 the resist 26 and overlying metal 30 deposited thereon are removed. The wafer is subjected to a suitable heat treatment to alloy the P-type ohmic metal 30 to the P-type gate regions 19 forming gate contact members.

Figure 10:
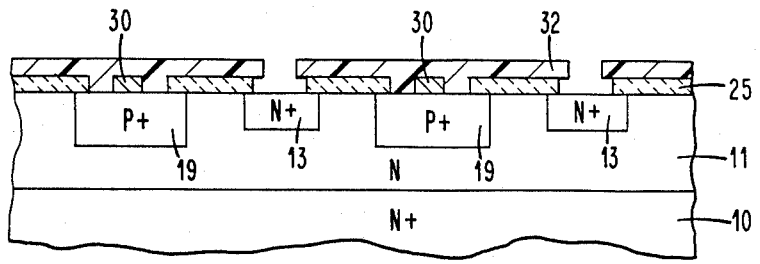
Figure 11:
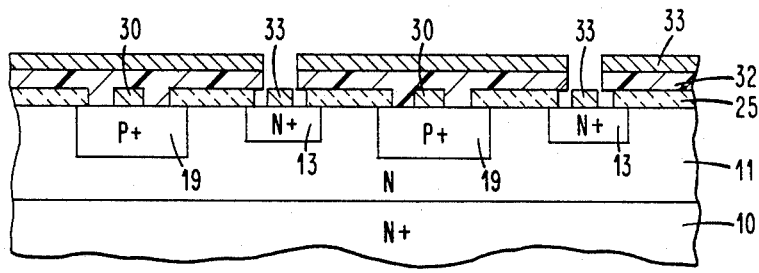

Then, as illustrated in FIG. 10, the wafer is coated with a layer of a photoresist material 32. Employing known photolithographic masking and etching techniques openings are formed in the silicon nitride 25 to expose portions of the source regions 13. An N-type ohmic metal 33, for example, nickel, a gold germanium alloy, or gold is deposited on the wafer as illustrated in FIG. 11. The metal 33 deposits onto the N-type source regions 13 as determined by the openings in the mask 32. The resist 32 and overlying metal 33 are then removed. The wafer is heated to alloy the N-type ohmic metal 33 to the source regions 13 forming source contact members. Any slight misalignment of the N-type ohmic metal 33 with the source regions 13 would not be critical since the source contact members would merely contact a part of the N-type channel of the device. Misalignment of the P-type ohmic metal 30 with respect to the gate regions 19, however, would lead to shorting of the junctions and consequently an inoperative device. As explained hereinabove, the process as disclosed prevents such a misalignment of the gate structure from occurring.

Figure 12:
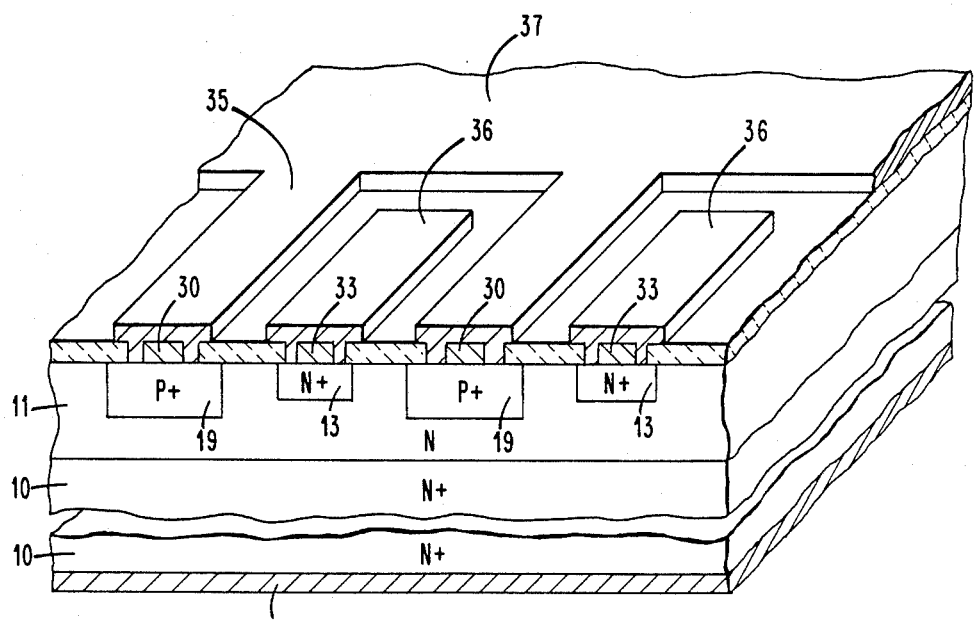
FIG. 12 is a perspective view in cross-section of the fragment of the wafer upon completion of the steps of fabricating a static induction transistor in accordnce with the method of the present invention.

Next, as illustrated in FIG. 12, metal, specifically gold, is deposited over the wafer and selectively removed to form a gate interconnection 35 in contact with each of the elongated gate contact members 30 and a source interconnection 36 in contact with each of the elongated source contact members 33. As illustrated in FIG. 12 the gate interconnection 35 includes a bonding pad 37. The source interconnection 36 also includes a bonding pad (not shown). Slight misalignment of the gold interconnection pattern is not critical since the gate junctions are protected by the overlying silicon nitride as explained previously. Also as illustrated in FIG. 12, a suitable metal or combination of metals is deposited on the underlying surface of the substrate 10 to provide ohmic contact thereto and form a suitable drain connection 39.

The process in accordance with the present invention as described hereinabove provides for the fabrication of junction field effect transistors, specifically of the static induction transistor type, by a self-alignment process. The process does not employ techniques of growing a localized native oxide from the material of the semiconductor body as with LOCOS. The process is, therefore, suitable for fabricating devices in compound semiconductor materials such as GaAs and InP.

While there has been shown and described what is considered a preferred embodiment of the present invention, it will be obvious to those skilled in the art that various changes and modifications may be made therein without departing from the invention as defined by the appended claims.

What is claimed is:

1. The method of fabricating a junction field effect transistor comprising providing a body of semiconductor material including a substrate of semiconductor material of one conductivity type of relatively low resistivity and a layer of semiconductor material of the one conductivity type of relatively high resistivity contiguous said substrate, said layer having a surface at a surface of the body;

introducing conductivity type imparting material of the one conductivity type into a plurality of spaced-apart source regions in said layer at said surface;

forming a first undercut mask on said surface having a plurality of openings, each opening exposing a portion of said surface intermediate between two adjacent source regions, said first undercut mask being undercut at each opening so that the opening is wider at said surface than at a distance from the surface;

introducing conductivity type imparting material of the opposite conductivity type into a plurality of gate regions in said layer at said surface defined by the plurality of openings in said first undercut mask;

depositing dielectric material onto said surface through the openings in said first undercut mask so as to form a plurality of temporary gate members, each being wider at its base contiguous with said surface than at its uppermost portion spaced from said surface;

removing said first undercut mask to expose said surface except the portions thereof occupied by the temporary gate members;

depositing a layer of adherent, nonconductive, protective material on the exposed surface and on the temporary gate members;

depositing masking material on said layer of adherent, nonconductive, protective material;

removing masking material to expose the portions of the layer of adherent, nonconductive, protective material overlying the uppermost portions of the temporary gate members;

removing said temporary gate members and portions of the layer of adherent, nonconductive, protective material adjacent thereto so that the remaining masking material forms a second undercut mask having a plurality of openings, each opening exposing a portion of the surface of one of said gate regions, said second undercut mask being undercut at each opening so that the opening is wider at said surface than at a distance from the surface;

depositing a conductive material for making ohmic contact to semiconductor material of the opposite conductivity type onto a portion of the exposed surface of each of said gate regions defined by the openings in the second undercut mask to form a plurality of gate contact members;

removing the second undercut mask;

forming a plurality of openings in said layer of adherent, nonconductive, protective material, each opening exposing an area of the surface of a source region;

depositing a conductive material for making ohmic contact to said semiconductor material of the one conductivity type onto a portion of the exposed surface area of each of said source regions to form a plurality of source contact members; and applying conductive material to form a source interconnection in contact with said source contact members and to form a gate interconnection in contact with said gate contact members.

2. The method in accordance with claim 1 wherein introducing conductivity type imparting material of the opposite conductivity type into a plurality of gate regions includes ion-implanting conductivity type imparting material of the opposite conductivity type into said gate regions;

and including, after removing said first undercut mask, heating to remove lattice damage and electrically activate the implanted ions and to diffuse conductivity type imparting material of the opposite conductivity type farther into the layer of semiconductor material so that the gate regions of the opposite conductivity type extend laterally beyond the temporary gate members to form rectifying junctions having their edges at the exposed surface.

3. The method in accordance wih claim 2 wherein removing said temporary gate members and portions of the adherent, nonconductive, protective material adjacent thereto includes leaving portions of said adherent, nonconductive, protective material overlying the junctions between the gate regions of the opposite conductivity type and the contiguous semiconductor material of the one conductivity type.

4. The method in accordance with claim 3 wherein depositing dielectric material onto said surface through the openings in the first undercut mask so as to form a plurality of temporary gate members includes evaporating dielectric material so as to impinge on said surface at angles of other than 90° to said surface and deposit under overhanging portions of the undercut first undercut mask.

5. The method in accordance with claim 4 wherein depositing masking material on said layer of adherent, nonconductive, protective material includes applying the masking material to provide a surface thereof parallel to said surface of the body; and removing masking material to expose the portions of the layer of adherent, nonconductive, protective material overlying the uppermost portions of the temporary gate members includes reactive ion etching masking material from the surface thereof to a depth to expose the portions of the layer of adherent, nonconductive, protective material overlying the uppermost portions of the temporary gate members.

6. The method in accordance with claim 5 wherein removing said temporary gate members and the portions of the layer of adherent, nonconductive, protective material includes reactive ion etching so as to selectively etch the material of the temporary gate members and of the layer of adherent, nonconductive, protective material.

7. The method in accordance with claim 6 wherein said dielectric material forming said temporary gate members is silicon dioxide.

8. The method in accordance with claim 7 wherein said adherent, nonconductive, protective material deposited on the exposed surface and on the temporary gate members is silicon nitride.

9. The method in accordance with claim 8 wherein introducing conductivity type imparting material of the one conductivity type into a plurality of spaced-apart source regions includes ion-implanting conductivity type imparting material of the one conductivity type into said spaced-apart source regions;

and including, annealing to remove lattice damage and to electrically activate the implanted ions.

10. The method in accordance with claim 9 including applying conductive material to said substrate to form an ohmic conductive drain contact thereto.

11. The method in accordance with claim 10 wherein said semiconductor material is a compound semiconductor material.

12. The method in accordance with claim 11 wherein said semiconductor material is gallium arsenide.

13. The method in accordance with claim 12 wherein said one conductivity type is N-type; and said opposite conductivity type is P-type.

* * * * *